United States Patent [19]

Lewiner et al.

[11] Patent Number: 4,673,885
[45] Date of Patent: Jun. 16, 1987

[54] DEVICES FOR READING THE QUANTITIES OF ELECTRICAL CHARGES BORNE BY A DIELECTRIC

[76] Inventors: Jacques Lewiner, 5, rue Bory d'Arnex, 92210 Saint Cloud; Georges Charpak, 37, rue de la Plaine, 75020 Paris; Elie Pollak, 60, rue de Talma, 94400 Vitry sur Seine, all of France

[21] Appl. No.: 630,117

[22] Filed: Jul. 12, 1984

[30] Foreign Application Priority Data

Jul. 13, 1983 [FR] France ................................ 83 11741

[51] Int. Cl.[4] ............................................. G01R 29/12
[52] U.S. Cl. .................................... 324/457; 324/452; 361/220
[58] Field of Search ............... 324/452, 454, 455, 456, 324/457, 458, 109, 72, 72.5, 73 PC, 123 R; 361/212, 220; 355/14 CH

[56] References Cited

U.S. PATENT DOCUMENTS

| 3,013,203 | 12/1961 | Allen | 324/455 |
| 3,676,769 | 7/1972 | Loepfe | 324/454 |
| 4,050,019 | 9/1977 | Nirschl | 324/123 R X |
| 4,103,231 | 7/1978 | Nemcek, Sr. | 324/123 R |
| 4,117,715 | 10/1978 | Hoenig | 324/452 |
| 4,233,562 | 11/1980 | Blythe | 324/452 |
| 4,424,481 | 1/1984 | Laroche et al. | 324/458 X |

Primary Examiner—Reinhard J. Eisenzopf
Assistant Examiner—Robert W. Mueller
Attorney, Agent, or Firm—Larson and Taylor

[57] ABSTRACT

The invention relates to a device for reading the quantities of electrical charges borne by a dielectric sheet using a probe scanning the charged surface of the sheet and connected to an electronic circuit adapted to measure the quantities of charges induced on said probe. This electronic circuit comprises an operational transimpedance amplifier and an analog integrator reset to zero periodically by suitable circuitry.

1 Claim, 2 Drawing Figures

DEVICES FOR READING THE QUANTITIES OF ELECTRICAL CHARGES BORNE BY A DIELECTRIC

BACKGROUND OF THE INVENTION

The invention relates to devices for reading the amounts of electrical charges borne by a dielectric sheet, this term "sheet" denoting both, in the following, a sheet proper and an analogous support such as a plate, a drum or a layer coating a flat or cylindrical surface.

These devices enable the "reading" of data or images recorded electrically on such sheets.

By the expression "reading" is meant in the present description both reading proper manifested by the display of an indication on a suitable apparatus, with or without recording and the determination of an immediately employed magnitude, without special display, particularly for recording purposes, for automatic correction, for warning or the like.

The invention is aimed more particularly, among reading devices of the type concerned, at those which comprise a first electrode positioned facing the surface of the sheet bearing charges to be read, said electrode being called "probe" in the following, a second electrode positioned against the surface, of the sheet, opposite the probe, means for passing the sheet opposite the probe or inversely, and electronic means to measure at each moment the quantities of the image charges induced on the probe by the quantities of charges to be read.

It is aimed more particularly also at electronic means, for measuring image charges, comprised by the reading devices concerned.

In known modes of construction, these electronic means were designed to carry out measurements on the potentials of the image charges concerned.

These electronic means presented certain drawbacks.

In particular they required very high input impedances, which rendered these devices:

of poor stability over time in view of the inevitable progressive degradation of the high impedance components as a result of humidity and other sources of pollution, which generate leakage paths, sensitive to electromagnetic interferences, high impedances playing the role of an antenna with respect to them, and, especially, relatively inaccurate due to the fact of the low value of the signal/noise ratio.

GENERAL DESCRIPTION OF THE INVENTION

It is a particular object of the invention to overcome the aforesaid drawbacks.

Accordingly, in reading devices of the type concerned according to the invention, the electronic means for measuring quantities of image charges are provided so as to measure the electric currents $I_o$ produced on the probe on the induction of these image charges.

To this end, these electronic means comprise:

an input amplifier provided and mounted so that, on the one hand, it transforms the current $I_o$ applied to one of its inputs into amplified output voltages $V_1 = K\, I_o$, in which formula K denotes a coefficient having the dimensions of an impedance, and that, on the other hand, its input potential, which is that of the probe, remains permanently as close as possible to the reference potential, generally nil, to which the second above electrode is brought, and an analog integrator of the voltage $V_1$ associated with chronic reset to zero means actuated at moments when the probe is positioned facing a zone, of the sheet, brought to reference potential.

In preferred embodiments, recourse is had in addition to one and/or the other of the following arrangements, the input amplifier is an operational transimpedance amplifier, the relative movement between the probe and the sheet to be read is effected by line-scanning and the chronic reset to zero of the integrator is effected automatically at least once on the scanning of each line, particularly at the start of this scanning, the probe then passing opposite a line borne by the sheet and subject to the reference potential.

The invention comprises, apart from these main features, certain features which are preferably used at the same time and which will be more explicitly discussed below.

BRIEF DESCRIPTION OF THE DRAWINGS

In the following, a preferred embodiment of the invention will be described with reference to the accompanying drawing given, of course, purely as a nonlimiting example.

In the drawing.

DESCRIPTION OF A PREFERRED EMBODIMENT

The electrical charges, of which it is desired to read off the quantities q, are borne by a dielectric sheet 1.

In manner known in itself, this sheet 1 may be in the form of a sheet proper or in that of any other support (strip, disk, drum . . . ) extending essentially over two dimensions and of which the third dimension corresponds to a relatively small thickness. This thickness is generally comprised between 10 and 100 microns.

The constituent dielectric of the sheet is advantageously constituted by an insulating material, particularly of a plastics type (polypropylene, polytetrafluoroethylene, polyamide . . . ) or inorganic (glass . . . ), or again by a photoconductive material (cadmium sulfide, selenium, polyvinylcarbazole . . . ).

Figure 1:
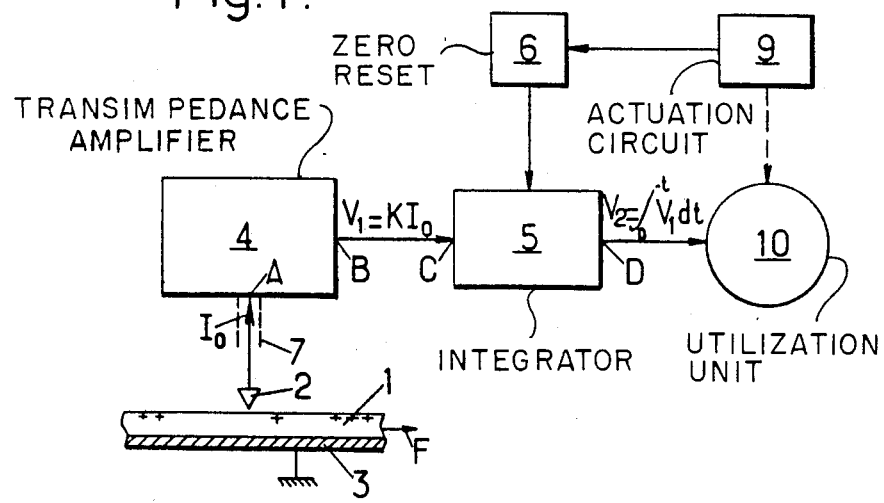
FIG. 1, shows a block diagram of a reading device constructed according to the invention.

The electrical charges concerned have been represented + signs in FIG. 1 purely for illustration since they could just as well be negative charges as positive charges.

They are borne by one of the two surfaces of the sheet concerned in the sense that they are localized on said surface in the vicinity of the latter, that is to say at a very slight depth in the sheet.

Facing this electrically charged surface of the sheet is placed the free end of a measuring electrode 2 which will be called "probe" in the following, said end being presented generally in the form of a cylindrical tip of revolution of small diameter (for example comprised between 0.1 and 5 mm).

A second electrode 3 is applied against a surface, of the sheet 1, further spaced from the probe 2: the second electrode is advantageously constituted by a thin metal layer applied against said sheet.

The two electrodes 2 and 3 constitute the two plates of a capacitor framing the charged dielectric 1 to be studied.

Means symbolized by the arrow F are provided to cause the sheet 1 to pass in front of the probe 2.

When the electrical charges are present facing this probe, they induce on the end of the latter image charges of opposite sign.

The measurement of the quantities of charges q borne by the sheet 1 facing the probe 2 therefore comes back to the measurement of the quantities of image charges q' induced on this probe.

It is more precisely the latter measurement which is concerned by the present invention.

To be able to carry out said measurement in a sensitive, accurate and reliable manner, according to the invention, this measurement is based not on the potentials of the image charges, but on the electrical currents $I_o$ generated by these image charges on their creation or, what comes back to the same thing, by the variations in the quantities of charges q borne by the sheet 1 and passing opposite the probe 2.

To this end, recourse is had to the system of the two following stages:

an input amplifier 4 of which one of the inputs A is connected to the probe 2, said amplifier being arranged so as to develop on its output B an amplified voltage $V_1$ proportional to the current $I_o$ flowing in said input A, an analog integrator 5 of which the input C is supplied by the output of the amplifier 4, arranged so as to develop on its output D a voltage $V_2$ proportional to the integral over time of the voltage $V_1$, this integrator being associated with a device 6 enabling it to be reset to zero chronically in order to eliminate errors of drift.

A shielding 7 surrounding the probe 2 and the above input A is brought to the same reference potential as a second electrode 3: this potential is generally selected as nil, the electrode 3 and the shielding 7 then being grounded, as illustrated.

Independently of the fact that its transfer function is a conversion of electrical current into electrical voltage, the input amplifier 4 has the following characteristics:

its input potential, which is that of the probe 2, remains as constant as possible and as close as possible to the reference potential, its input capacity is low and limited practically to the interfering capacity existing between the probe and ground at the level of the input shielding 7, its response must be correct within the spectral range concerned: thus, to avoid distortion of a signal whose duration is 1 ms (corresponding to the reading of a line 1 mm thick by a probe 1 mm in diameter, for a relative passage speed of the probe with respect to the sheet of 1 m/s), a response time of the order of 10 $\mu$s must be provided corresponding to a frequency of 100 kHz.

Such an amplifier 4, called a transimpedance, or again "controlled voltage-current source", is preferably a compensated operational amplifier mounted as an inverter.

Figure 2:
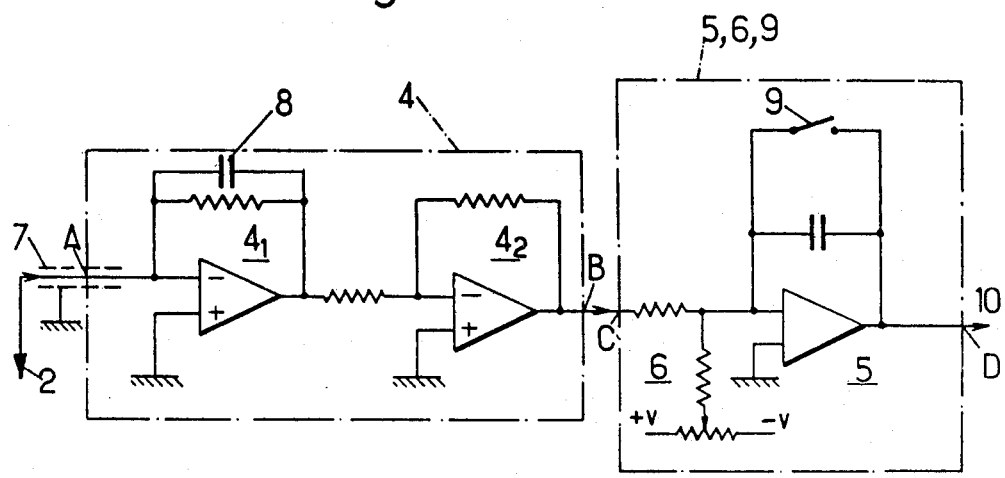
FIG. 2 is an electronic diagram in more detail of such a device.

In the diagram of FIG. 2, this amplifier 4 is constituted by two operational amplifiers $4_1$ and $4_2$ in series, of which the first comprises a reaction capacity 8 adapted to adjust its response in frequency.

The analog integrator 5 can be constituted for its part by an operational amplifier mounted as an integrator, as is seen in FIG. 2.

The voltage $V_2$ developed by this integration is connected directly to the quantities of electrical charges q to be measured themselves and not to the variations q' of these charges.

To calibrate this voltage $V_2$ correctly in absolute value, that is to say to correct the inevitable drift errors, a chronic reset to zero of the electronic assembly is ensured.

This reset to zero is effected at moments when the quantity of charge borne by the sheet opposite the probe is a reference quantity, preferably nil.

There is advantageously provided for this purpose on the sheet to be studied special lines brought to an electrical reference potential—which may or may not be that of ground—and intended to be scanned chronically by the probe, the resetting to zero then being effected systematically by means of a suitable synchronization device 9, at the moments when these lines pass in front of the probe.

For example, it is possible to arrange such a vertical line to the left of a sheet intended to be read by successive horizontal line scanning; a second vertical line of the same type can then be added at the middle of the width of the sheet if the drift to be corrected is too large.

In FIG. 2, the calibration or reset to zero means 6 have been shown diagrammatically by a potentiometer and the chronic actuation or synchronization means or circuit 9, by a switch.

The voltage signal $V_2$ developed by the integrator 5, then calibrated chronically by the members 6 and 9, is then employed in any suitable way in the utilization means or unit which have been shown diagrammatically by the circle 10 in FIG. 1.

This employment is advantageously a numeric sampling for a recording and/or reproduction of an image.

As a result of which, and whatever the embodiment adopted, there is finally obtained a reading device for electrical charges whose constitution and operation result sufficiently from the foregoing.

This device has numerous advantages over those previously known and particularly the following:

the reading performances are better preserved over time considering that the apparatus is less sensitive to humidity or to other causes of pollution, particularly at the level of the probe, this reading is less disturbed by electromagnetic interferences, and, especially, the signal/noise ratio of the reading is distinctly higher than with prior solutions based on the measurement of potentials, which leads to improved accuracy and sensitivity: in particular the reading concerned enables the reading of electrical charges having much lower densities than before and hence to take into account much finer variations of this density on sheets to be analyzed; this possibility is particularly valuable in the field of radiography of living creatures by means of X-rays since it permits the doses of radiations necessary to reach a given degree of contrast in the images to be analyzed, to be all the more reduced.

As is self-evident, and as emerges besides already from the foregoing, the invention is in no way limited to those of its types of application and embodiments which have been more especially envisaged; it encompasses, on the contrary, all modifications.

We claim:

1. Device for reading quantities of electrical changes borne by a dielectric sheet comprising, on opposite side of the sheet, respectively, a first electrodal probe, and a second electrode at a reference potential, means for providing relative movement between the sheet and the probe and electronic means for measuring at each moment the quantities of image charges induced on the probe by the quantities of charges to be read, said electronic measuring means being provided so as to measure the electrical current $I_o$ produced on the probe in response to the induction of the image charges on the probe and comprising: a transimpedance input amplifier for transforming the currents $I_o$ applied to one of the inputs thereof into amplified output voltages $V_1 = K\ I_o$, wherein K denotes a coefficient having the dimensions of an input impedance, and being connected such that the input potential thereto, which is the same as that of the probe, remains substantially constant at a value close to the reference potential; and an analog integrator means for providing integration of the voltage $V_1$ and including reset to zero means actuated at moments when the probe is positioned opposite a zone of the dielectric sheet at the reference potential.

* * * * *